United States Patent [19]

Nawaki

[11] Patent Number: 5,216,678
[45] Date of Patent: Jun. 1, 1993

[54] TEST METHOD FOR A SEMICONDUCTOR MEMORY DEVICE APPLIED TO A MARGIN TEST

[75] Inventor: Masaru Nawaki, Nara, Japan
[73] Assignee: Sharp Kabushiki Kaisha, Osaka, Japan
[21] Appl. No.: 591,117
[22] Filed: Oct. 1, 1990

[30] Foreign Application Priority Data

Oct. 3, 1989 [JP] Japan ................... 1-258035

[51] Int. Cl.⁵ ........................... G06F 11/22
[52] U.S. Cl. ................... 371/68.1; 371/21.1; 371/28
[58] Field of Search ........ 371/68.1, 28, 21.1, 371/21.2; 324/73.1, 210, 211

[56] References Cited

U.S. PATENT DOCUMENTS 3,027,542  3/1962  Silva ........................... 371/28
4,418,403  11/1983 O'Toole et al. ............. 371/27
4,502,140  2/1985  Proebsting ................... 371/28

OTHER PUBLICATIONS

Publication entitled "Integrated Circuit Technical Data" dated Jan. 25, 1988.

Primary Examiner—Robert W. Beausoliel, Jr.
Assistant Examiner—Trinh Tu

[57] ABSTRACT

There is provided a test method for a semiconductor memory device which can be applied to a margin test, for example. The memory device has two types of sense amplifiers each composed of a layout pattern symmetrical to the other and arrayed such that the layout patterns alternate, memory cells, bit lines which are connected to the sense amplifiers and which carry signals expressing data stored in the memory cells, work lines, gates connected to bit lines, and a comparator which receives signals on bit lines via the gates and determines whether or not the signals match. The test method has a step which stores identical data in the memory cells connected by the bit lines to the two types of sense amplifiers; a step which raises the level of word line, communicating the memory cell to the bit line to receive a signal expressing the stored data from the memory cell on the bit line, and amplifying by means of the sense amplifier the signal expressing the stored data; and a step which communicates the bit lines connected to differing types of sense amplifiers to the comparator by turning the gates ON, and compares the signals on the bit lines amplified by differing types of sense amplifiers to detect data errors or data not matching.

2 Claims, 2 Drawing Sheets

TEST METHOD FOR A SEMICONDUCTOR MEMORY DEVICE APPLIED TO A MARGIN TEST

BACKGROUND OF THE INVENTION

The present invention relates to a test method for a semiconductor memory device.

As such a conventional semiconductor memory device, there is provided a dynamic random access memory (DRAM) device exemplified by the diagram in FIG. 2. This DRAM has a symmetrical pattern due to limitations on the circuit layout, and includes two types of sense amplifiers SAMP1', SAMP2', SAMP3', and SAMP4'. In FIG. 2, the type of sense amplifier is indicated by the facing of the letter "F". At every other intersection between the pairs of bit lines B1'-B1#', B2'-B2#', B3'-B3#', B4'-B4#' connected to sense amplifiers respectively and the word lines W1', W2', W3', W4' is provided a memory cell MC11', MC12', MC13'... MC44'. Each pair of bit lines is connected to a corresponding pair of transfer gates TR1'--TR1#', TR2'-TR2#', TR3'-TR3#', TR4'-TR4#', and pairs of transfer gates TR1'-TR2', TR1#'-TR2#', TR3'-TR4', and TR3#'-TR4#' are connected by means of data lines D1', D1#', D2', and D2#', respectively, to a comparator 100'. The on/off states of transfer gates TR1', TR1#' and TR3', TR3#' are controlled by a control signal CSEL1' and those of transfer gates TR2', TR2#' and TR4', TR4#' are controlled by a control signal CSEL2'. In all cases, the gate is ON when the control signal CSEL1' or CSEL2' is a HIGH level, and is OFF when the control signal is a LOW level.

The comparator 100' receives the signals from two pairs of bit lines connected to two of the four sense amplifiers over the data lines D1', D1#', D2', and D2#', and compares the signal carried by data line D1' with the signal carried by data line D2' and the signal carried by data lines D1#' with the signal carried by data line D2#' to determine data matching. To test the operation of this DRAM, an identical datum (HIGH) is written to and stored in the two memory cells connected to the sense amplifiers with identical layout patterns, e.g., memory cells MC11' and MC31' connected to SAMP1' and SAMP3', respectively. A word line W1' is then made on, communicating memory cells MC11', MC31' to the respective bit lines B1', B3', thus creating potential differences between each pair of bit lines B1'-B1#' and B3'-B3#', respectively. These potential differences are amplified by sense amplifiers SAMP1' and SAMP3'.

If sense amplifiers SAMP1' and SAMP3' are functioning normally, bit lines B1', B3' will both become HIGH according to the datum HIGH written to the memory cells MC11' and MC31', and the bit lines B1#', B3#' will both be LOW. Furthermore, by setting the control signal CSEL1' HIGH when the control signal CSEL2' is LOW (i.e., transfer gates TR2', TR2#', TR4', TR4#' are OFF), the transfer gates TR1', TR1#', TR3', and TR3#' become ON, and the two pairs of bit lines B1', B1#' and B3', B3#' are communicated to data lines D1', D1#', D2', D2#'. The levels of bit lines B1', B1#' and B3', B3#' are then compared via the respective data lines by the comparator 100'. Normal operation is determined when the levels of bit lines B1' and B3', and B1#' and B3#' match, and abnormal operation is determined at all other times. Thus, two memory cells are read simultaneously and their states are compared in an operation test. Known as a multiple bit test method, this test method can be used to greatly reduce the required testing time for large capacity DRAM devices.

However, a completely symmetrical layout pattern cannot be drawn for two inputs to each of the sense amplifiers SAMP1', SAMP2', SAMP3', SAMP4' above. As a result, there is a tendency to amplify so that one of the bit lines is constantly HIGH and the other is LOW due to the asymmetrical nature of the layout pattern regardless of whether one of the bit lines in one pair is a high potential or low potential (hereinafter the potential high-low relationship) when the potential difference before amplification is small in a pair of bit lines connected to each of the sense amplifiers SAMP1' to SAMP4'. For example, this tendency appears when the potential level of the ON word line W1' is low, or when the accumulation charges in the memory cells communicated to bit lines B1', B3' are low. Furthermore, when this tendency appears, a correlative phenomenon in which the potential high-low relationship of a pair of bit lines reverses before and after amplification (hereinafter erroneous operation) sometimes appears.

Because two sense amplifiers with the same layout pattern, e.g., SAMP1' and SAMP3', are operated simultaneously and the potential high-low relationship of two pairs of bit lines connected to those sense amplifiers SAMP1' and SAMP3', i.e., B1', B1#' and B3', B3#' in this example, is compared in the conventional multiple bit test method described above, when the aforementioned erroneous operation occurs, the potential high-low relationships in each pair match because there is a tendency to amplify in the same direction in this erroneous operation. For example, if the bit lines B1' and B3' have a (slightly) higher potential than the bit lines B1#' and B3#', respectively, before amplification, and both sense amplifiers SAMP1' and SAMP3' operate erroneously with a tendency to amplify in the same direction, the bit lines B1#' and B3#' will be HIGH and the bit lines B1' and B3' will be LOW after amplification, and the potential high-low relationships of the two pairs of bit lines B1', B1#' and B3', B3#' will match. Because the levels of the data lines D1', D2' and D1#', D2#' are respectively HIGH and LOW at this time, the comparator 100' is unable to detect this erroneous operation. Thus, the conventional multiple bit test method described above cannot be applied to a so-called margin test wherein the power supply voltage Vcc is sequentially decreased from HIGH to LOW to test for normal operation.

SUMMARY OF THE INVENTION

Therefore, the object of the present invention is to provide a test method which is a multiple bit test method for a semiconductor memory device, and which can be applied to a margin test.

In order to achieve the aforementioned object, a test method according to an embodiment of the present invention for a semiconductor memory device comprising two types of sense amplifiers each comprising of a layout pattern symmetrical to the other and arrayed such that the layout patterns alternate, memory cells, bit lines which are connected to the sense amplifiers and which carry signals expressing data stored in said memory cells, word lines connected to said memory cells, gates connected to bit lines, and a comparator which receives signals carried on bit lines connected to two sense amplifiers via the gates and determines whether or not, the signals match. The test method comprising the steps of storing identical data in the memory cells connected by means of said bit lines to said two types of sense amplifiers raising the level of said word line, communicating said memory cell to the bit line to receive a signal expressing the stored data from the memory cell on the bit line and; amplifying by means of the sense amplifier the signal expressing said stored data; communicating the bit lines connected to differing types of sense amplifiers to the comparator by turning the gates On; and comparing the signals on the bit lines amplified by differing types of sense amplifiers to detect data matching.

Because the signals on the bit lines are amplified by sense amplifiers each with a layout pattern symmetrical to the other, the amplification direction of each sense amplifier differs from the other even when a tendency to amplify the contents of the signal on the bit line to either a HIGH or LOW level direction appears regardless of the contents of the signals before amplification due to the asymmetry of the layout pattern of each sense amplifier. Therefore, when the contents of the signals on the bit lines to be compared are the same before amplification and erroneous operation occurs, the contents of the signals on the bit lines differ from each other, and the non-matching of the two signals is correctly detected by the comparator when the gate connected to each bit line is turned on. Thus, when the power supply voltage Vcc is sequentially reduced from HIGH to LOW in a margin test and erroneous operation occurs, the comparator can detect the erroneous operation. It is therefore possible to apply the test method according to the present embodiment to a margin test.

It is to be noted that when the sense amplifier operates normally, the signals on the bit lines are amplified in the same direction as before amplification, and the matching of the two signals is detected by the comparator.

BRIEF DESCRIPTION OF THE DRAWINGS

The present invention will become more fully understood from the detailed description given below and the accompanying diagrams wherein.

DETAILED DESCRIPTION OF PREFERRED EMBODIMENTS

A preferred embodiment of a test method for a semiconductor memory device is described in detail hereinbelow with reference to the accompanying figure.

Figure 1:
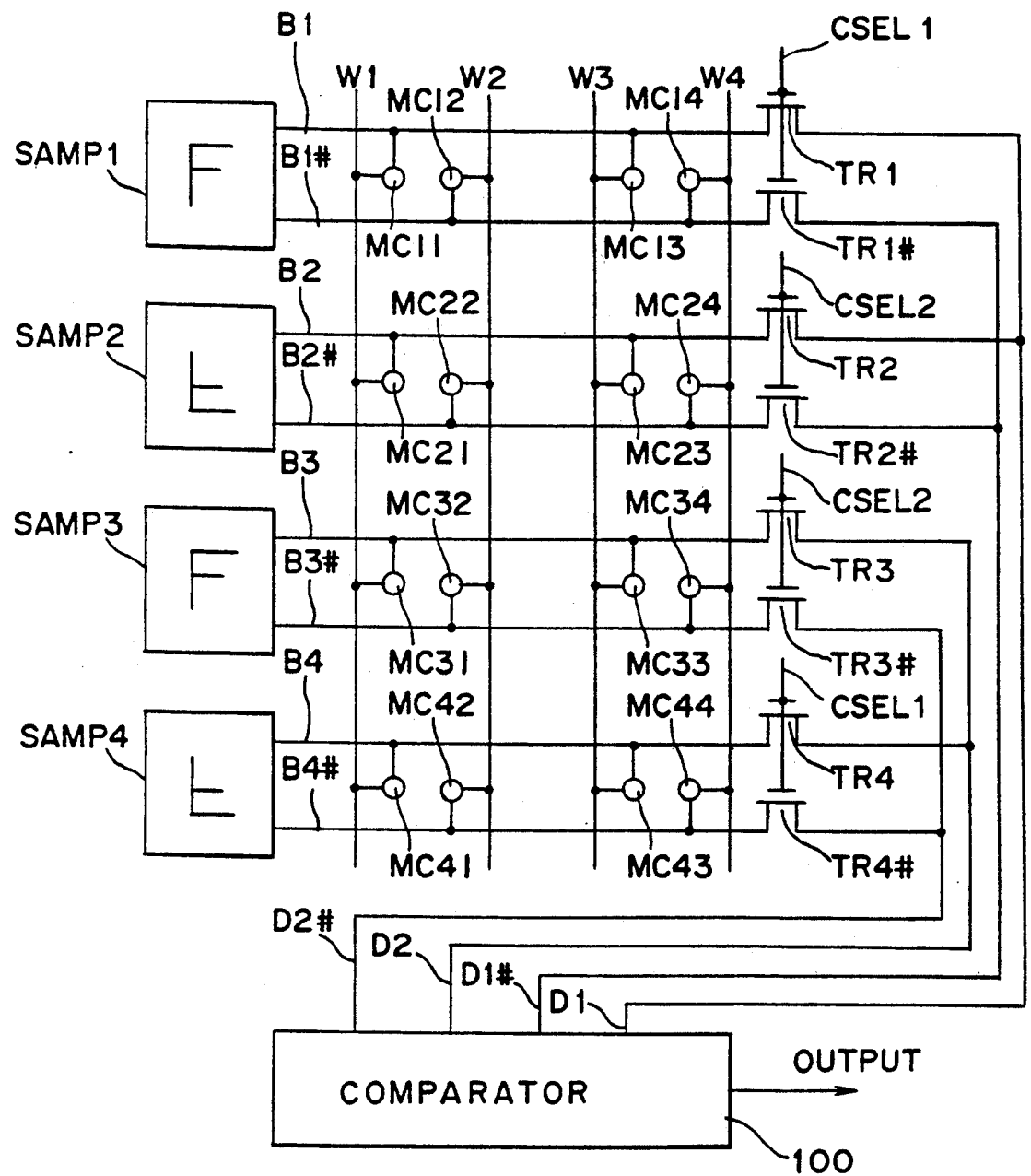
FIG. 1 is a diagram used to describe the operation of a test method according to a preferred embodiment of the present invention for a semiconductor memory device.
Figure 2:
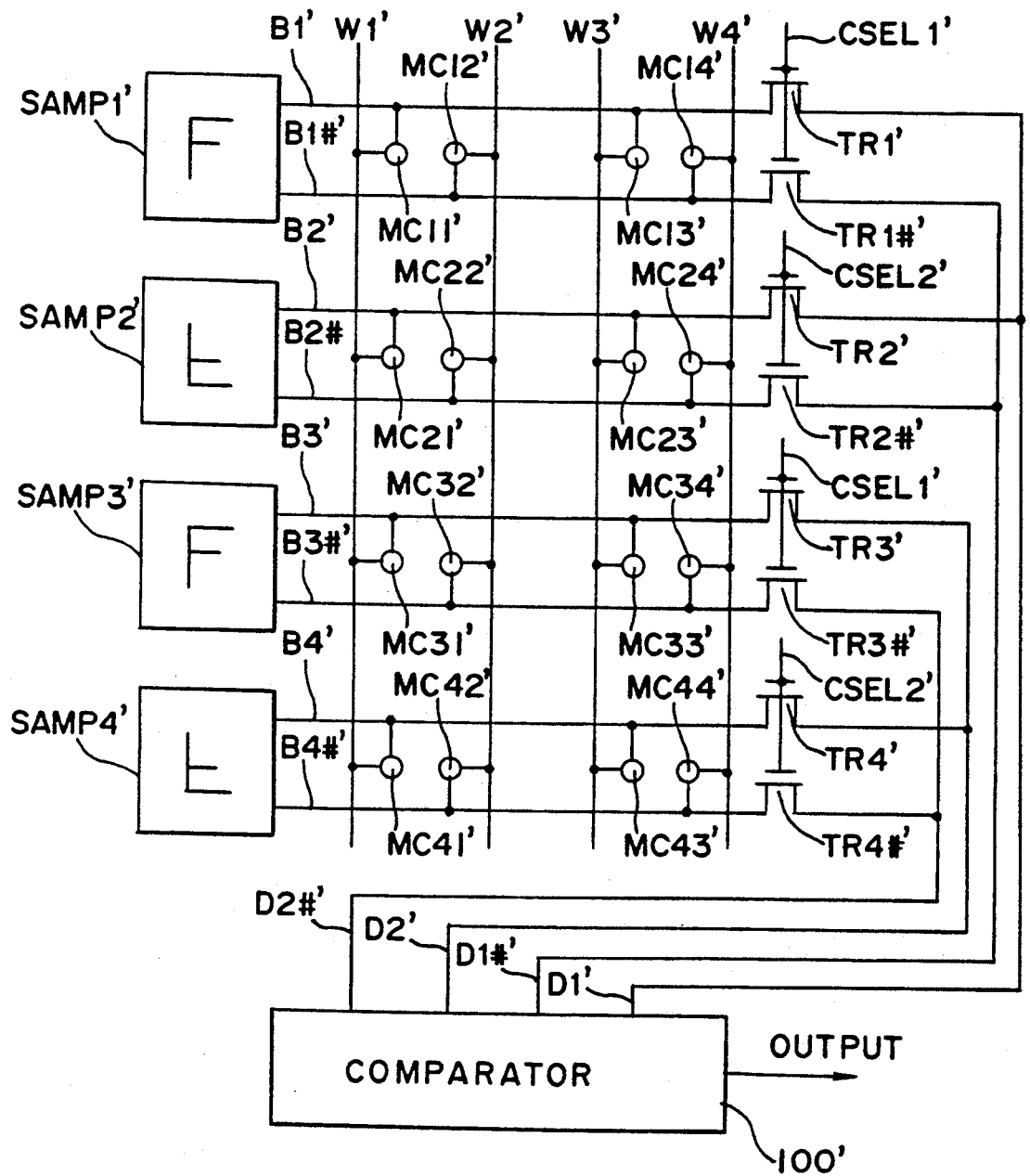
FIG. 2 is a diagram used to describe the operation of a conventional test method for a semiconductor memory device.

In this description, a DRAM device constructed as shown in FIG. 1 is used for explanation. This DRAM device is constructed identically to that shown in FIG. 2, and like parts are identified by like reference numbers with the omission of the distinguishing apostrophe (') suffixing each part in FIG. 2. It is to be noted that unlike the DRAM shown in FIG. 2, transfer gates TR1, TR1#, TR4, and TR4# shown in FIG. 1 are on/off controlled by the control signal CSEL1, and transfer gates TR2, TR2#, TR3, and TR3# are on/off controlled by the control signal CSEL2.

An identical datum HIGH is first stored in the memory cells connected to two sense amplifiers for which the layout pattern of each is symmetrical to that of the other, for example to memory cells MC11, MC41 connected to sense amplifiers SAMP1 and SAMP4, respectively. The level of the word line W1 is then raised, communicating memory cells MC11, MC41 to bit lines B1, B4, and creating potential differences between each pair of bit lines B1, B1# and B4, B4# respectively. These potential differences are sense amplified by sense amplifiers SAMP1, SAMP4.

With the control signal CSEL2 in a LOW state (i.e., transfer gates TR2, TR2#, TR3, TR3# are off), transfer gates TR1, TR1#, TR4, TR4# are made on by setting the control signal CSEL1 to HIGH, and the corresponding two pairs of bit lines B1, B1#, and B4, B4# communicate with the corresponding data lines D1, D1#, D2, D2#. The levels of bit lines B1 and B4, and B1# and B4# are then compared by the comparator 100 via the respective data lines. Normal operation is determined when the levels of bit lines B1 and B4, and B1# and B4# match, and erroneous operation is determined when the levels do not match.

When the sense amplifiers SAMP1 and SAMP4 operate normally during sense amplification, the bit lines B1, B4 become HIGH in accordance with the datum HIGH stored in the memory cells MC11, MC41, and bit lines B1#, B4# become LOW. The levels of bit lines B1 and B4, and B1# and B4# thus match, and the comparator 100 determines correct operation. On the other hand, when there are slight potential differences between bit lines B1 and B1#, and between bit lines B4 and B4# before amplification and erroneous operation caused by the asymmetry of the layout pattern in each sense amplifier occurs, the amplification tendency differs because the layout patterns of the sense amplifiers SAMP1 and SAMP4 are each symmetrical to the other, and the potential high-low relationship after amplification differs between bit line pairs B1, B1# and B4, B4#. For example, if the tendency is for sense amplifier SAMP1 to amplify bit line B1 in the HIGH direction and B1# in the LOW direction, sense amplifier SAMP4 will tend to amplify bit line B4 to LOW and B4# to HIGH. Thus, the levels of bit lines B1 and B4, and B1# and B4# will not match, and an erroneous operation will be detected by the comparator 100.

Thus, when erroneous operation is caused by sequentially decreasing the power supply voltage Vcc from HIGH to LOW in a margin test, the occurrence of erroneous operation can be detected by the comparator 100. Thus, this multiple bit test method can be applied to a margin test.

It is to be noted that the present embodiment as described hereinabove applies to a multiple bit test method for a DRAM device, but the present invention shall not be limited to such application and can also be applied to a multiple bit test method of other types of semiconductor memory devices. Furthermore, the bit lines connected to each sense amplifier need not necessarily be complementary, but may also be independent bit lines.

As will be known from the above description, because a test method according to the present invention for a semiconductor memory device receives a signal expressing stored data from a memory cell on a bit line and amplifies the signal by means of a sense amplifier, the bit lines connected to two types of sense amplifiers, the layout pattern of each being symmetrical to that of the other, are then communicated to a comparator by setting a gate on, and the signals on the bit lines amplified by two types of symmetrical sense amplifiers are compared to detect level matching, this multiple bit test method can be applied to a margin test for a semiconductor memory device including sense amplifiers each having a layout pattern symmetrical to the other.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A test method for a semiconductor memory device comprising first and second types of sense amplifiers, said first type of sense amplifier having a layout pattern symmetrical to said second type of sense amplifier and said first and second types of sense amplifiers being arrayed such that the layout patterns alternate, memory cells, bit lines which are connected to the sense amplifiers for carrying signals expressing data stored in said memory cells, word lines connected to said memory cells, gates connected to said bit lines, and a comparator for receiving signals carried on said bit lines connected to the sense amplifiers via the gates and determining whether or not the signals match, said test method comprising the steps of:

storing identical data in the memory cells connected by means of said bit lines to said first and second types of sense amplifiers;

raising the level of said word line for communicating said memory cell to the bit line to receive a signal expressing the stored data from the memory cell on the bit line, and amplifying by means of the sense amplifier the signal expressing said stored data; and communicating the bit lines connected to one of said first types and one of said second types of sense amplifiers to the comparator by turning the gates ON, which are connected to said bit lines corresponding to said one first type and said one second type of sense amplifiers, by applying a control signal and comparing the signals on the bit lines amplified by said first and second types of sense amplifiers to detect data error or to detect data failing to match.

2. A testing system for a semiconductor memory device comprising:

first and second types of sense amplifiers having a symmetrical layout pattern and being arrayed so that said symmetrical layout patterns alternate;

a pair of first and second bit lines connected to said first and second types of sense amplifiers for carrying signals;

a plurality of word lines selected and activated by signals;

a plurality of memory cells connected to said bit lines and word lines for storing data therein;

a first plurality of transfer gates connected to a first control signal and said first and second bit lines corresponding to one of said first types of sense amplifiers and one of said second types of sense amplifiers;

a second plurality of transfer gates connected to a second control signal and said first and second bit lines corresponding to one of said first types of sense amplifiers and one of said second types of sense amplifiers, said first plurality of transfer gates and said second plurality of transfer gates alternately being turned on;

storing means for storing identical data in each of said memory cells connected to said first and second bit lines and to one of said first and second types of sense amplifiers; and a comparator connected to the outputs of each of said first and second transfer gates for comparing the signals on said bit lines amplified by said first and second types of sense amplifiers in response to turning on said first transfer gates or said second transfer gates in turn with said first or second control signals respectively to detect data error or to detect data failing to match.

* * * * *